US009343668B2

United States Patent
Maxwell et al.

(10) Patent No.: US 9,343,668 B2
(45) Date of Patent: May 17, 2016

(54) LOW TEMPERATURE IN-SITU DOPED SILICON-BASED CONDUCTOR MATERIAL FOR MEMORY CELL

(71) Applicant: Crossbar, Inc., Santa Clara, CA (US)

(72) Inventors: Steve Maxwell, Sunnyvale, CA (US); Sundar Narayanan, Santa Clara, CA (US); Sung Hyun Jo, Sunnyvale, CA (US); Tanmay Kumar, Pleasanton, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 13/831,043

(22) Filed: Mar. 14, 2013

(65) Prior Publication Data

US 2014/0264250 A1   Sep. 18, 2014

(51) Int. Cl.
*H01L 47/00* (2006.01)
*H01L 45/00* (2006.01)
*H01L 27/24* (2006.01)

(52) U.S. Cl.
CPC ............ *H01L 45/12* (2013.01); *H01L 27/2463* (2013.01); *H01L 45/085* (2013.01); *H01L 45/1233* (2013.01); *H01L 45/1253* (2013.01); *H01L 45/148* (2013.01); *H01L 45/16* (2013.01)

(58) Field of Classification Search
CPC ............ H01L 27/2463; H01L 45/1233; H01L 45/085; H01L 45/148
USPC ............................................................ 257/5
See application file for complete search history.

(56) References Cited

U.S. PATENT DOCUMENTS

| | | | |
|---|---|---|---|
| 2007/0295950 A1* | 12/2007 | Cho | H01L 45/12 257/4 |
| 2012/0108030 A1* | 5/2012 | Herner | 438/382 |
| 2013/0221315 A1* | 8/2013 | Wang et al. | 257/4 |

* cited by examiner

*Primary Examiner* — Mohsen Ahmadi
*Assistant Examiner* — Frederick B Hargrove
(74) *Attorney, Agent, or Firm* — Amin, Turocy & Watson, LLP

(57) ABSTRACT

Providing for two-terminal memory cell structures and fabrication that can be achieved with a relatively low temperature process(es) is described herein. By way of example, disclosed two-terminal memory cells can be formed at least in part as a continuous deposition, potentially yielding improved efficiency in manufacturing. Furthermore, various embodiments can be compatible with some existing complementary metal oxide semiconductor fabrication processes, reducing or avoiding retooling overhead that might be associated with modifying existing fabrication processes in favor of other two-terminal memory cell fabrication techniques.

20 Claims, 10 Drawing Sheets

US 9,343,668 B2

LOW TEMPERATURE IN-SITU DOPED SILICON-BASED CONDUCTOR MATERIAL FOR MEMORY CELL

TECHNICAL FIELD

The subject disclosure relates generally to semiconductor memory technology, more specifically, some embodiments of the present invention relate to a low temperature silicon based conductor for memory cell technology.

BACKGROUND

The inventors of the present invention have been focusing research in the area of resistive-switching memory within the field of integrated circuit technology. While much of resistive-switching memory technology is in the development stage, various technological concepts for resistive-switching memory have been demonstrated by the inventors and are in one or more stages of verification to prove or disprove associated theory(ies). The inventors believe that resistive-switching memory technology promises to hold substantial advantages over competing technologies in the semiconductor electronics industry.

The inventors of the present invention have studied resistive-switching memory cells that can be configured to have a plurality of states with distinct resistance values. For instance, the plurality of states can include a relatively low resistance state and a relatively high resistance state, in a single bit cell. Multi-bit cells might have additional states with respective resistances that are distinct from each other and from the relatively low resistance state and the relatively high resistance state. The distinct resistance states of the resistive-switching memory cell represent distinct logical information states, facilitating digital memory operations. Accordingly, the inventors believe that arrays of many such memory cells, therefore, can provide many bits of digital memory storage.

In various embodiments, the inventors induce resistive-switching memory cells to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. To have a memory cell maintain a state, the inventors recognize that other conditions may be required (e.g., existence of a minimum operating voltage, existence of a minimum operating temperature, and so forth), or no conditions be met, depending on the characteristics of a memory cell device.

In light of the above, the inventors desire to make further innovations in the area of resistive-switching semiconductor technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the subject application relate to two-terminal memory cell structures and fabrication that can be achieved with a relatively low temperature process(es). In addition, one or more embodiments of disclosed two-terminal memory cells can be formed as a continuous deposition, potentially yielding improved efficiency in manufacturing. Furthermore, various embodiments can be compatible with some existing complementary metal oxide semiconductor (CMOS) fabrication processes, reducing or avoiding retooling overhead that the inventors of the subject disclosure believe to be associated with modifying existing fabrication processes in favor of two-terminal memory cell structures.

In further embodiments, the subject disclosure provides a two-terminal memory cell having a silicon based conductor material. The silicon based conductor material can be doped to provide a target resistivity. In some aspects disclosed herein, the target resistivity can be selected to be suitable to serve as an electrode or a wire for the resistive-switching memory cell. Furthermore, the conductor material can be doped at a temperature less than 450 degrees Celsius, facilitating compatibility with many CMOS-related fabrication processes. According to at least one additional aspect of the subject disclosure, the two-terminal memory cell can comprise a resistive-switching component having a silicon-based material. Further, the resistive-switching component and the silicon-based conductor material can be adjacent layers of the two-terminal memory cell without an intervening interface layer.

In an additional embodiment(s) of the subject application, disclosed is a memory cell. The memory cell can comprise a silicon (Si) stack comprise a plurality of Si-based layers configured to have a first electrical state in response to application of a first electrical signal to the memory cell and a second electrical state in response to application of a second electrical signal to the memory cell, wherein the second electrical signal has a different magnitude or polarity than the first electrical signal. Moreover, the memory cell can comprise a wiring layer comprised of Si or a Si derivative configured to facilitate application of the first electrical signal or the second electrical signal to the memory cell, wherein the wiring layer is formed adjacent to the Si stack at a temperature less than 400 degrees Celsius.

Another embodiment of the subject application describes a method of fabricating a memory cell. The method can comprise forming an electrode layer comprised of Si or a Si derivative adjacent to a substrate and doping the electrode layer in-situ at a temperature less than 450 degrees Celsius. In addition, the method can comprise forming a first Si layer adjacent to the electrode layer and doping the first Si layer in-situ such that the electrode layer and the first Si layer are in contact without an intervening resistive interface.

Still other embodiments provide a crossbar memory array. The crossbar memory array can comprise a plurality of memory cells, wherein at least one of the plurality of memory cells is configured to have properties defined by a first electrical state in response to a first electrical signal and a second electrical state in response to a second electrical signal, and further wherein the plurality of memory cells are arranged in an array comprising at least two-dimensions. Further, the crossbar memory array can comprise a wiring component configured to facilitate delivery of the first or second electrical signal, wherein the wiring component is comprised of Si and doped in-situ adjacent to a complementary metal-oxide semiconductor (CMOS) substrate via a plasma-enhanced chemical vapor deposition at a temperature of less than 400 degrees Celsius.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
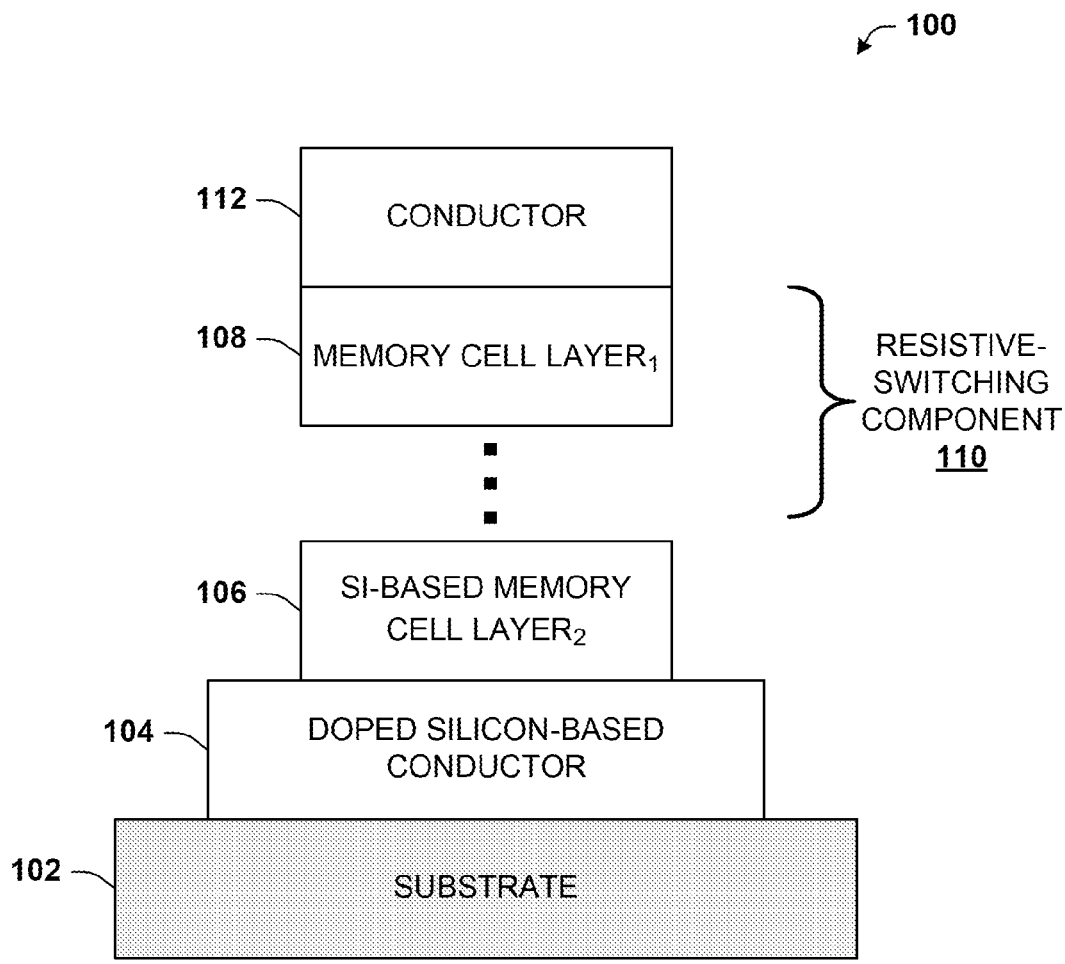
FIG. 1 illustrates a block diagram of an example two-terminal memory cell according to one or more embodiments disclosed herein.

This disclosure relates to two-terminal memory cells, particularly resistive-switching two-terminal memory cells, in various embodiments. Resistive-switching two-terminal memory cells (also referred to as resistive-switching memory cells or resistive-switching memory), as utilized herein, comprise circuit components having two conductive contacts (also referred to herein as electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe, or the like), a resistive switching layer (RSL) and an active metal layer for providing filament forming ions to the RSL. The p-type or n-type Si bearing layer can include a p-type or n-type polysilicon, p-type or n-type SiGe, or the like. The RSL (which can also be referred to in the art as a resistive switching media (RSM)) can comprise, e.g., an undoped amorphous Si layer, a semiconductor layer having intrinsic characteristics, a Si sub-oxide, and so forth. Examples of the active metal layer can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer in some aspects of the subject disclosure. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

One example of a conductive filament device is a three-layer memory cell arrangement of metal/amorphous Si (a-Si)/metal. This three-layer memory cell is an example of an a-Si resistive switching device. The a-Si layer essentially serves as a digital information storage medium. A resistive switching behavior is often characterized in terms of conductive filament formation inside an otherwise non-conductive a-Si material.

To program one or more disclosed embodiments, a suitable program voltage can be applied across the memory cell causing a conductive filament to form through a resistive portion of the memory cell, as mentioned above. This can further cause the memory cell to switch from a relatively high resistive state, to a relatively low resistive state. An erase process can be implemented to reverse the foregoing, at least in part, causing the memory cell to return to the high resistive state from the low resistive state. This change of state, in the context of memory, can be associated with respective states of a binary bit. Accordingly, multiple such memory cells can be programmed or erased to represent respective zeroes or ones of binary information, and by retaining those states over time in effect storing binary information. For various reasons, resistive switching memory cells are generally quick to program and responsive, changing state readily in response to a program voltage. This quick switching of state is a significant advantage of various disclosed memory cells over other memory cell technologies.

It should be appreciated that a variety of RSL memory cell technologies exist, having different physical properties. For instance, some embodiments of the subject disclosure can have different discrete programmable resistances, different associated program/erase voltages, as well as other differentiating characteristics. For instance, in a unipolar embodiment, once a memory cell is initially programmed, the memory cell can be later programmed in response to a first positive voltage (e.g., three volts) and erased in response to a second positive voltage (e.g., between four and five volts). Other embodiments can alternatively exhibit bipolar characteristics, and become programmed in response to a positive voltage and erased in response to a negative voltage. Where an embodiment described herein does not specify a unipolar or bipolar characteristic, or does not indicate suitable program/erase voltages, it is intended that such aspects and embodiments incorporate any suitable memory cell technology and be operated by program/erase voltages appropriate to that memory cell technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Many of these devices include materials that are incompatible with many common CMOS fabrication processes. Accordingly, expensive fabrication overhead costs (e.g., retooling, redesign, retesting, etc.) are projected in association with producing these devices. In addition, these devices can exhibit relatively slow switching speeds, small on/off resistance ratios (e.g., leading to small sensing margin) or poor thermal stability, as well as other problems.

Compatibility with CMOS fabrication processes is anticipated by the inventors of the present disclosure to be a significant factor related to fabrication cost reduction for new types of electronic memory. Some proposed resistive-switching memory cells are constrained by CMOS fabrication constraints, including process temperature(s), memory cell material(s), wiring or electrode material(s), memory cell material(s), dopant material(s), and so forth. For example, to avoid overhead costs in retooling CMOS fabrication equipment, resistive-switching memory can often involve memory elements built on a Si wafer. Interconnecting the Si wafer and the memory elements can involve several layers of interconnects, often involving metals such as Aluminum (Al) or Copper (Cu). Due to relatively low softening temperatures of these metals, fabrication of the memory elements can be constrained to 450 degrees Celsius or less (e.g., for Al interconnect technology).

Temperatures employed for CMOS-related fabrication can limit the materials that might be employed to reduce or avoid interconnect layers between a CMOS-related substrate (e.g., a Si wafer) and wiring layers or current control layers of a two-terminal memory cell. As one example, a suitable electrical conductor (e.g., a wire, an electrode, a terminal, etc.) or current control layer (e.g., a deposited film or films having respective resistivity values) between the Si wafer and a resistive layer of the two-terminal memory cell, could be made out of a Si or Si derivative at high temperatures. For instance, Si (or a Si derivative) doped with boron utilizing a thermal anneal at about 750 degrees Celsius can provide a conductive Si material. Moreover, the conductive Si material can have a relatively wide range of resistivity, based on a selected density of boron doping. However, the 750 degree Celsius process clearly exceeds the 450-degree CMOS-related fabrication temperature. Accordingly, the inventors of the present application believe that a low temperature process for forming a conductive element made of Si or a Si derivative would be an improvement in resistive-switching memory cell technology. Such improvements can include avoiding interface layers, or reducing a number of interface layers, between a Si wafer and storage-related layers of a memory cell, mitigating or avoiding costs of retooling and redesigning CMOS-related fabrication equipment, compatibility with existing patterning and etching processes, and others.

To address the foregoing and related concerns, various aspects of the subject disclosure provide for Si-based, conductive memory cell components that can be formed at relatively low temperatures. In some embodiments, disclosed is a Si or Si derivative (referred to hereinafter collectively as Si-based) film that can be doped in-situ at relatively low temperature. Examples of suitable Si derivatives can include Si Germanium (SiGe), Si carbide, or the like. In one or more disclosed embodiments, the film can be a doped film deposited utilizing a Low Pressure Chemical Vapor Deposition (LPCVD) or a plasma-enhanced chemical vapor deposition (PECVD) process. The doping can comprise an n-type (e.g., phosphorous, or other suitable n-type dopant) or p-type (e.g., boron, or other suitable p-type dopant) dopant selected to have a suitable dopant concentration yielding a target resistivity in the film. Moreover, a plurality of layers of the film can be deposited, each with respective dopants or dopant concentrations (and corresponding resistivity). In addition, these layers of the film can be formed as a continuous deposition process. Such a continuous process can avoid interface layers (or reduce their number) between layers of a memory cell, between current control components of the memory cell (e.g., a resistive Si-based film(s)) and conductive memory cell components (e.g., wires, electrodes), or between the conductive memory cell components and a Si substrate. In at least one embodiment, the Si-based conductive memory cell components can facilitate layering of multiple arrays of memory cells in a third dimension, yielding a greater density of memory cells per unit of area on a Si chip.

In some embodiments disclosed herein, a doped Si-based conductive film can be deposited at less than about 450 degrees Celsius. In other embodiments, the doped Si-based conductive film can be deposited at less than about 350 degrees Celsius. In additional embodiments, the doped Si-based conductive film can be deposited at less than about 300 degrees Celsius. In at least one embodiment, the doped Si-based conductive film can be deposited between about 290 and about 250 degrees Celsius. These relatively low temperature deposition processes can facilitate a significant reduction in fabrication complexity for memory cell technology, reducing cost of fabrication, enabling use of a wider array of techniques, processes, materials, dopants, etches and patterns, and the like, to additional memory cell technologies, such as two-terminal memory cell technologies, resistive-switching memory cell technologies, or the like, or suitable combinations thereof. In some embodiments of the present invention, the dopant is activated upon deposition, and does not require a separate anneal step.

Referring now to the drawings, FIG. 1 illustrates a block diagram of an example memory cell 100 according to one or more aspects of the subject disclosure. Memory cell 100 can be a resistive-switching memory cell, in at least some aspects. However, memory cell 100 is not limited to these aspects, and can be another suitable memory cell technology in other aspects (e.g., a two-terminal memory technology, a three-terminal semiconductor transistor, or other suitable memory cell).

Memory cell 100 can comprise a substrate 102. Substrate 102 can serve as a bottom layer of memory cell 100, as well as one or more other memory cells in a memory array, for instance (e.g., see FIG. 9, infra). Thus, substrate 102 need not be exclusive to memory cell 100 in some disclosed aspects. Additionally, substrate 102 can be a Si wafer, a suitable Si derivative (e.g., SiGe) or other suitable substrate for a semiconductor chip (e.g., memory, processor, etc.). In various disclosed aspects, substrate 102 can be a substrate that is employed for, or compatible with, CMOS semiconductor processes, including masking processes, etching processes, patterning processes, or the like, or combinations thereof. Accordingly, in some embodiments, substrate 102 may have any suitable number of CMOS-compatible devices formed therein, including logic, drivers of memory cell 100, or the like.

Memory cell 100 can also comprise a doped Si-based conductor 104. Doped Si-based conductor 104 can be formed of Si or a suitable Si derivative (e.g., SiGe, Si carbide, or other suitable Si layer that can be doped for controlled resistivity). Furthermore, doped Si-based conductor 104 can be doped with conductive ions at a relatively low temperature. In some aspects, the doping process can include a PECVD process or a LPCVD process conducted at or below 450 degrees Celsius. Because of the low temperature doping process, memory cell 100 can be compatible with many existing CMOS fabrication techniques. Further, metals having relatively low melting or softening temperatures (though not depicted by FIG. 1) can be utilized for memory cell 100. For instance, an Al wire could be positioned between substrate 102 and doped Si-based conductor 104 in one or more aspects of the subject disclosure. Because of the low temperature PECVD or LPCVD process, doped Si-based conductor 104 can be doped with ions despite the relatively low melting point of the Al wire. In some aspects, the PECVD doping process can be conducted at or below 350 degrees Celsius. In other aspects, the PECVD doping process can be conducted at or below 300 degrees Celsius. In at least one additional aspect, the PECVD doping process can be conducted between about 250 and about 290 degrees Celsius. In various embodiments, the dopants within the as-deposited doped Si-based conductor 104 are activated upon deposition, accordingly no separate, dedicated, high-temperature anneal process is required. Accordingly, doped Si-based conductor 104 has some level of conductivity (some level of resistivity) after being deposited. For example, doped Si-based conductor 104 can have a target conductivity value (a target resistivity value) after being deposited.

Doped Si-based conductor 104 can be provided with a selected resistivity value. For instance, the Si-based material of doped Si-based conductor 104 can be embedded with a suitable concentration of conductive ions to result in doped Si-based conductor 104 having the selected resistivity value. In some aspects, the dopant can be an n-type dopant, whereas in other aspects, the dopant can be a p-type dopant. In at least one disclosed aspect, the dopant can be boron ions, though the subject disclosure is not so limited. For instance, in various other aspects, the dopant can be indium, gallium, phosphorus, arsenic, or antimony, or a suitable combination of p-type or n-type dopants.

In various embodiments, memory cell 100 can optionally comprise one or more current control layers. For instance, a Si-based memory cell layer$_2$ 106 can be a Si-based film deposited on doped Si-based conductor 104. In some aspects, the deposition can be accomplished without intervening layers or material between doped Si-based conductor 104 and Si-based memory cell layer$_2$ 106 (e.g., as part of a continuous deposition process wherein the conditions change during the deposition). Further, the one or more current control layers 106 can be doped to respective target resistivity values to facilitate the current control for memory cell 100.

Memory cell 100 can further comprise a resistive switching component 110 formed of one or more memory cell layers, at least one of which is adjacent to Si-based memory cell layer$_2$ 106 (or, e.g., adjacent to doped Si-based conductor 104 in an embodiment where memory cell 100 comprises no current control layers 106). Further, a subset of the one or more memory layers can be a Si-based film formed with the PECVD process similar to doped Si-based conductor 104. Subsequent memory cell layers, up through a top memory cell layer 108, can be successively stacked on or above the current control layer(s) (e.g., Si-based memory cell layer$_2$ 106), as depicted. At least a subset of the memory cell layers 108 can be configured to produce a resistive-switching component 110, in one or more aspects of the subject disclosure. The resistive-switching component 110 can have predetermined resistive-switching memory cell properties (e.g., an on-state resistance, or a set of multiple on-state resistances in the case of a multi-bit stack, an off-state resistance, an activation voltage, or a set of activation voltages in the case of the multi-bit stack, a de-activation voltage, and so on).

Memory cell layers 108, current control layers (e.g., Si-based memory cell layer, 106) or doped Si-based conductor 104, or a suitable combination thereof, can be deposited and doped with the low temperature PECVD or LPCVD process at or below 450 degrees Celsius, as described above. By selecting respective ions or ion concentrations for doping one or more of these layers, each of the respective layers can be given respective resistivity values. These resistivity values can be utilized, for instance, for providing conductivity properties, current control properties, or like properties.

In various embodiments, resistive-switching component 110, Si-based memory cell layer$_2$ 106, as well as doped Si-based conductor 104 can be formed as a continuous deposition process, without intervening interface layers. Such embodiments can reduce complexity and cost of fabricating memory cell 100. Furthermore, the continuous deposition and relatively low temperature PECVD or LPCVD doping process can make memory cell 100 compatible with CMOS-type fabrication equipment. This would help mitigate significant overhead costs that might otherwise be involved in retooling or redesigning fabrication equipment to manufacture memory cell 100.

The inventors of the subject application believe embodiments of the low-temperature and continuous deposition process can provide a significant practical advantage over other two-terminal memory designs that are less compatible with CMOS-type fabrication processes or equipment. These other two-terminal memory designs, therefore, might involve additional machine dies and tools, design of the dies and tools, and associated manufacturing costs. Furthermore, the inventors believe that several interface layers might be required to electrically interconnect various layers of these other two-terminal memory designs, due to temperature constraints or the use of non Si-based layers or substrate. Each of these constraints can add additional overhead, cost and fabrication complexity to the other two-terminal memory designs As depicted, memory cell 100 can comprise a conductor 112 (e.g., a top electrode) formed adjacent to top memory cell layer 108. In some aspects, conductor 112 can be a Si-based conductor doped to a predetermined resistivity value. In such case, conductor 112 could be formed as part of a continuous deposition with resistive-switching component 110. However, memory cell 100 is not limited to this aspect.

In various embodiments, due to the relatively low temperature processes of depositing and doping Si-based layers of memory cell 100, conductor 112 can be metal, even a metal with a relatively low softening or melting point such as Al, Cu, and others. In some embodiments, when conductor 112 includes a metal, a stack of metals may be used. For example, diffusion or barrier materials may also be used to contact top memory cell layer 108, such as titanium, titanium oxide, tungsten, titanium nitride, or the like. Additionally, a capping material may be the top layer of conductor 112, such as titanium, titanium oxide, tungsten, titanium nitride, or the like. As mentioned above, one or more conductive wires can optionally interconnect one or more layers of memory cell 100, and these conductive wires can be a Si-based deposition doped in-situ to a particular resistivity value (e.g., similar to doped Si-based conductor 104 or memory cell layers 106, 108), or can be a metal or other suitable electrical conductor.

Figure 2:
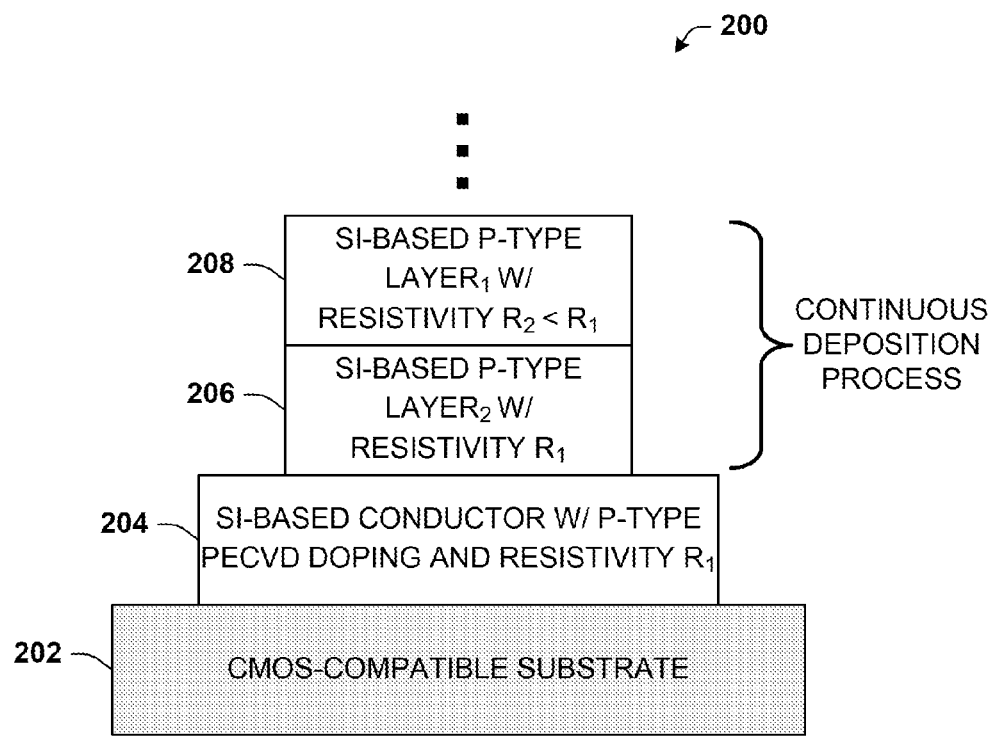
FIG. 2 depicts a block diagram of a sample two-terminal memory cell with p-type doping according to another embodiment.

FIG. 2 illustrates a block diagram of a sample memory cell 200 according to one or more additional embodiments of the subject disclosure. In some embodiments, at least a subset of memory cell 200 can be doped with p-type ions. A range of suitable dopant concentrations can vary from a p+ concentration to a p− concentration in various embodiments. In at least one embodiment, the dopant concentration can be between about $1E^{19}$ and about $1E^{21}$ ions per cubic centimeter (ion/cc), although the subject disclosure is not so limited. In light of the present patent disclosure, one of ordinary skill in the art will recognize other suitable dopant concentrations can be used, and these are considered within the scope of the subject disclosure. In various aspects described below, memory cell 200 can be a resistive-switching memory device, among other two-terminal memory cell devices.

Memory cell 200 can comprise a CMOS-compatible substrate 202. CMOS-compatible substrate can be a Si wafer, or other suitable substrate material (e.g., SiGe). As discussed in the embodiments above, substrate 202 may have one or more CMOS devices formed therein or thereon. Stacked atop CMOS-compatible substrate 202 is a Si-based conductor 204. Si-based conductor 204 can serve as a bottom electrode for memory cell 200 in some aspects of the subject disclosure. In other aspects, Si-based conductor 204 can serve as a conductive wire providing a conductive path from CMOS-compatible substrate 202 and other components of memory cell 200. For either use, Si-based conductor 204 can be a Si-based deposition film in one or more aspects, as previously described. In alternative or additional aspects, the Si-based film can be put onto a metal wire (e.g., Al, Cu, or other suitable conductive metal) associated with memory cell 200 or an array of such memory cells, though the subject disclosure is not limited to these aspects, and Si-based conductor 204 can be deployed without metal wiring.

In at least one disclosed aspect, Si-based conductor 204 can be a Si film deposition that is doped in-situ to have a target resistivity value, $R_1$. As discussed above, the dopants are activated upon deposition, accordingly no separate, high-temperature anneal process is required. The dopant can be a suitable p-type dopant (e.g., boron atoms, or the like) as noted at FIG. 2. The density of p-type dopant can be pre-selected to match the resistivity value $R_1$ and can be injected to the Si-based film utilizing a low temperature PECVD or LPCVD doping process. The temperature of the process can be less than 450 degrees Celsius (e.g., about 450 degrees, about 400 degrees, about 350 degrees, about 300 degrees, about 290 degrees, between about 290 degrees and about 250 degrees), enabling utilization of CMOS-type fabrication techniques for memory cell 200.

As illustrated in FIG. 2, a stack of layers is then deposited above Si-based conductor 204. This stack can include one or more layers, though two layers are depicted with memory cell 200. These layers include a Si-based p-type layer 206. Si-based p-type layer 206 is doped with p-type dopant material to have a selected resistivity value. In at least one aspect, the resistivity value of Si-based p-type layer 206 can be equal to or substantially equal to $R_1$. Thus, the resistivity value of Si-based p-type layer 206 can match or substantially match the resistivity value of Si-based conductor 204. In some disclosed embodiments, $R_1$ can have a range of values between about 10 milliOhm-centimeters (mOhm-cm) and about 10 Ohm-cm.

Additionally, a second Si-based p-type layer 208 can be formed above Si-based p-type layer 206. This second Si-based p-type layer 208 can also be doped with a respective resistivity value. In at least one disclosed aspect, the resistivity value of second Si-based p-type layer 208 can be equal to $R_2$, where $R_2 > R_1$. In one or more alternative or additional embodiments, $R_2$ can have a range of values between about 2 mOhm-cm and about 100 mOhm-cm.

In various embodiments, either or both of Si-based p-type layer 206 or second Si-based p-type layer 208 can be doped in-situ utilizing the relatively low temperature PECVD or LPCVD process described herein, at comparable temperatures (e.g., about 450 degrees, about 400 degrees, about 350 degrees, about 300 degrees, about 290 degrees, between about 250 degrees and about 290 degrees, and so on). For instance, Si-based conductor 204, Si-based p-type layer 206 or second Si-based p-type layer 208 can be respective ones of multiple Si-based films having a graded dopant profile, or an abrupt dopant profile, deposited back to back with or without interceding interface layers. Additionally, either or both of Si-based p-type layer 206 or second Si-based p-type layer 208 can be a Si film deposition, a SiGe film deposition, a Si-carbide film deposition, or the like, or a suitable combination thereof. Again, the dopants are typically activated upon deposition and a separate, high-temperature anneal process is not required.

As described, memory cell 200 can provide significant advantages over existing memory cells, alone or in a large array. For instance, because of the relatively low temperature deposition process, one or more metal wires, electrodes, contacts, etc., can optionally be employed for memory cell 200 (though not depicted) without fatally impacting the metal(s). In some aspects, however, a Si-based conductor 204 can be utilized in lieu of some or all such metals. The Si-based conductor 204 layer provides a significant advantage, particularly when adjacent to other Si-based layers of memory cell 200. For instance, a resistive switching component of memory cell 200 could comprise an amorphous Si layer, or other resistive material, in which a conductive filament is formed for resistive-switching features. Current control layers of memory cell 200 (e.g., Si-based p-type layer$_2$ 206 or Si-based p-type layer$_1$ 208) can be formed adjacent to the amorphous Si layer (or other suitable filament containing layer) via a continuous deposition process, without intervening layers (e.g., see FIGS. 4-6, infra). This can result in significantly reduced complexity associated with fabricating memory cell 200. Further, as mentioned above, other layers of memory cell 200 can be formed as a continuous deposition process, resulting in a simple fabrication process not only for memory cell 200, but for an array of such memory cells (e.g., see FIG. 9, infra) or multiple arrays stacked in a three-dimensional memory architecture (not depicted). In the latter three-dimensional memory architecture, for instance, the low temperature PECVD or LPCVD deposition facilitates multi-stack scaling with CMOS compatibility, without compromising sheet resistance of wiring layers at or near a bottom of the multi-stack, as more layers are deposited and doped on top.

Figure 3:
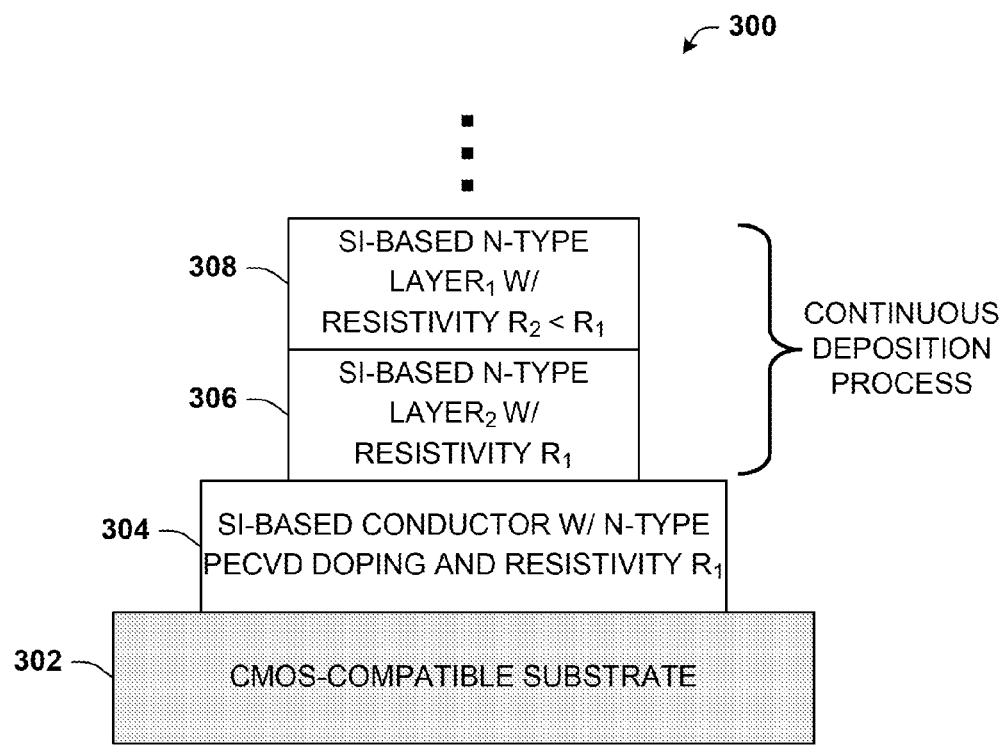
FIG. 3 illustrates a block diagram of a sample two-terminal memory cell with n-type doping according to still other embodiments.

FIG. 3 illustrates a block diagram of a sample memory cell 300 according to still other embodiments of the subject disclosure. Some or all layers of memory cell 300 can be doped with n-type ions in these embodiments. A range of suitable dopant concentrations can vary from a n+ concentration to a n− concentration in various embodiments. In at least one embodiment, the dopant concentration can be between about $1E^{19}$ and about $1E^{21}$ ion/cc, although the subject disclosure is not so limited. In light of the present patent disclosure, one of ordinary skill in the art will recognize other suitable dopant concentrations can be used, and these are considered within the scope of the subject disclosure. Similar to memory cell 200 of FIG. 2, supra, memory cell 300 can be a resistive-switching memory device, though memory cell 300 can also be another two-terminal memory cell device in various other aspects.

Memory cell 300 can comprise a CMOS-compatible substrate 302, which can be a Si wafer, or other suitable substrate material (e.g., SiGe), with one or more CMOS devices formed therein or thereon, as described above. Stacked atop CMOS-compatible substrate 302 is a Si-based conductor 304. Si-based conductor 304 can serve as a bottom electrode for memory cell 300 in some aspects, or as a conductive wire for memory cell 300. Si-based conductor 304 can be a Si-based film onto a metal wire (e.g., Al, Cu, or other suitable conductive metal) associated with memory cell 300 or an array of such memory cells, or can be deposited directly onto CMOS-compatible substrate 302.

In at least one disclosed aspect, Si-based conductor 304 can be a Si film deposition that is doped in-situ to have a target resistivity value, $R_1$ (note that $R_1$ of Si-based conductor 304 may or may not have any similarity to the value of $R_1$ of Si-based conductor 204 of FIG. 2, supra). The dopant can be a suitable n-type dopant (e.g., having excess electrons, or negative charge). The density of n-type dopant can be preselected to match the resistivity value $R_1$ and can be injected to the Si-based film utilizing a low temperature PECVD or LPCVD doping process. The temperature of the process can be less than 450 degrees Celsius (e.g., about 450 degrees, about 400 degrees, about 350 degrees, about 300 degrees, about 290 degrees, between about 290 degrees and about 250 degrees), enabling utilization of CMOS-type fabrication techniques for memory cell 300.

A stack of layers is deposited above Si-based conductor 304. This stack can include one or more layers, though two layers are depicted with memory cell 300. These layers include a Si-based n-type layer 306 and a second Si-based n-type layer 308. Si-based n-type layer 306 is doped with n-type dopant material to have a selected resistivity value. In at least one aspect, the resistivity value of Si-based n-type layer 306 can be equal to or substantially equal to $R_1$. Thus, the resistivity value of Si-based n-type layer 306 can match or substantially match the resistivity value of Si-based conductor 304.

In various embodiments, second Si-based n-type layer 308 can be formed above Si-based n-type layer 306 and can also be doped with a respective resistivity value. In at least one disclosed aspect, the resistivity value of second Si-based n-type layer 308 can be equal to $R_2$, where $R_2 > R_1$ (though similar to $R_1$, there may or may not be any relationship between a suitable value for $R_2$ of Si-based n-type layer 308 and the $R_2$ of Si-based p-type layer 208 of FIG. 2). In alternative or additional embodiments of the subject disclosure, $R_1$ can have a range of values between about 10 mOhm-cm and about 10 Ohm-cm, and $R_2$ can have a range of values between about 2 mOhm-cm and about 100 mOhm-cm. Table 1, below, provides various resistivity values in units of milliohm-cm for Si-based n-type layer 308, Si-based n-type layer 306 and Si-based conductor 304 of FIG. 3, and Si-based p-type layer 208, Si-based p-type layer 206 and Si-based conductor 204 of FIG. 2.

| Layer | Ranges (mΩ-cm) | Example Range (mΩ-cm) | Example Value (mΩ-cm) |
| --- | --- | --- | --- |
| Layer 304 | 1-1000 | 5-500 | 10 |
| Layer 306 | 1-1000 | 5-500 | 10 |
| Layer 308 | 100-50000 | 100-10000 | 1000 |
| Layer 204 | 1-1000 | 5-500 | 10 |
| Layer 206 | 1-1000 | 5-500 | 10 |
| Layer 208 | 100-50000 | 100-10000 | 1000 |

It should be appreciated that either or both of Si-based p-type layer 206 or second Si-based p-type layer 208 can be doped in-situ utilizing the relatively low temperature PECVD process or LPCVD process described above with respect to Si-based conductor 304. Further, Si-based conductor 304, Si-based n-type layer 306 or second Si-based n-type layer 308 can be respective ones of multiple Si-based films having a graded dopant profile, or an abrupt dopant profile, deposited back to back with or without interceding interface layers. Additionally, either or both of Si-based n-type layer 306 or second Si-based n-type layer 308 can be a Si film deposition, a SiGe film deposition, a Si-carbide film deposition, or the like, or a suitable combination thereof. Further, it should be appreciated that memory cell 300 can be configured to have additional layers in the stack of layers (e.g., Si-based layers, non Si-based layers, conductors such as a top electrode, and so forth), beyond those depicted. In various embodiments, as described above, dopants are activated upon deposition, accordingly, a separate, high-temperature anneal step is not required.

Figure 4:
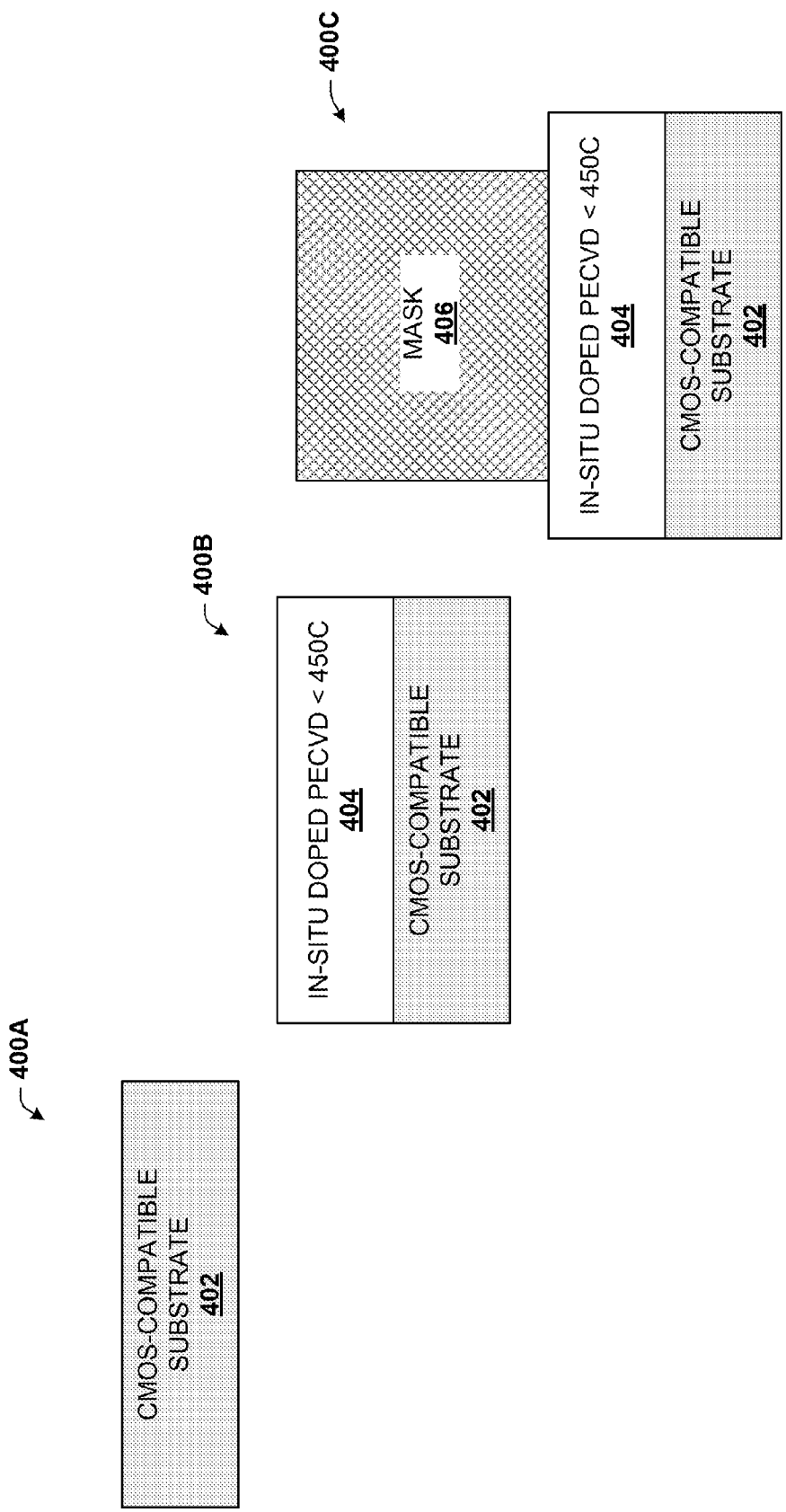
FIGS. 4-6 depict block diagrams of respective stages of an example fabrication process according to one or more aspects of the subject disclosure.
Figure 5:
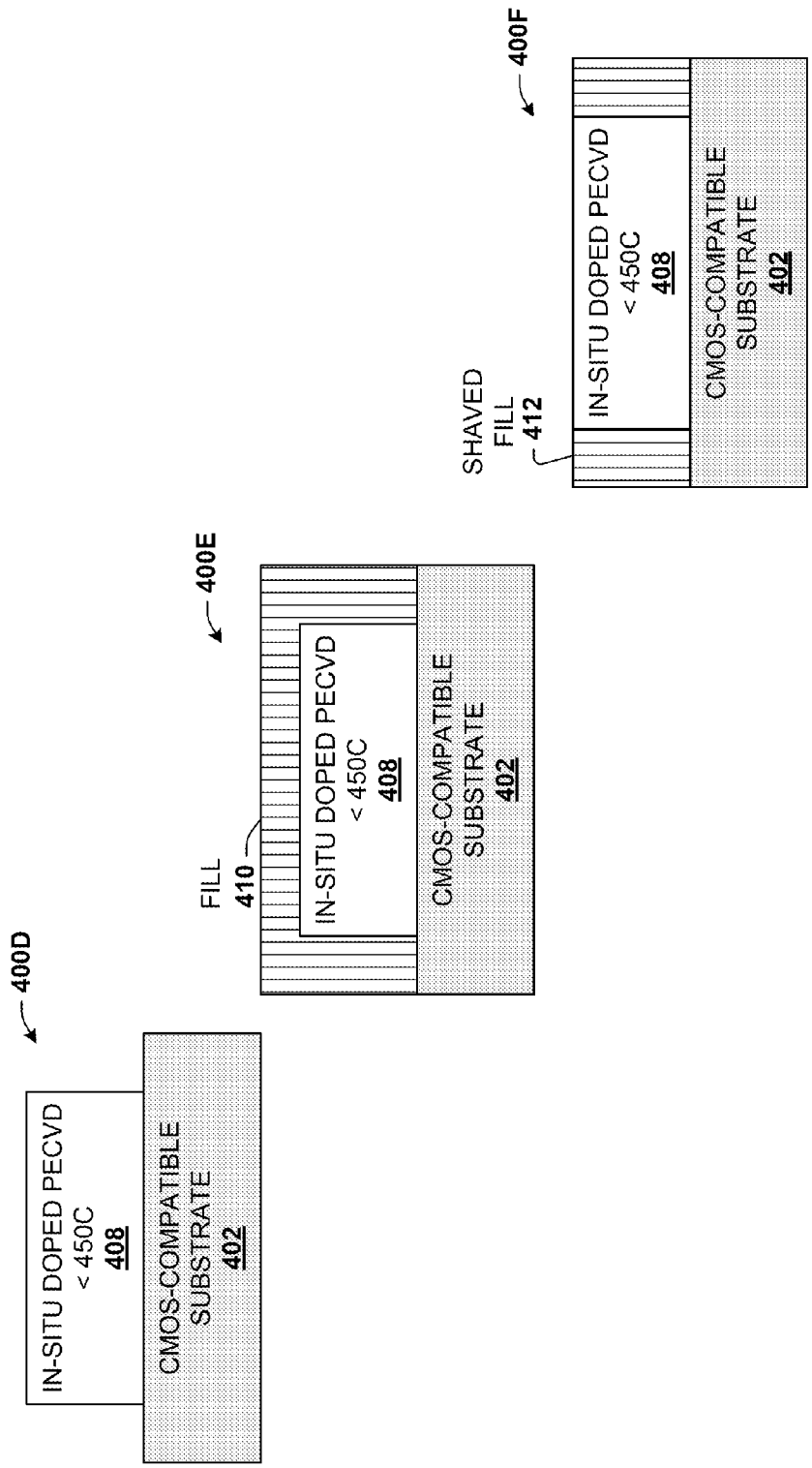
Figure 6:
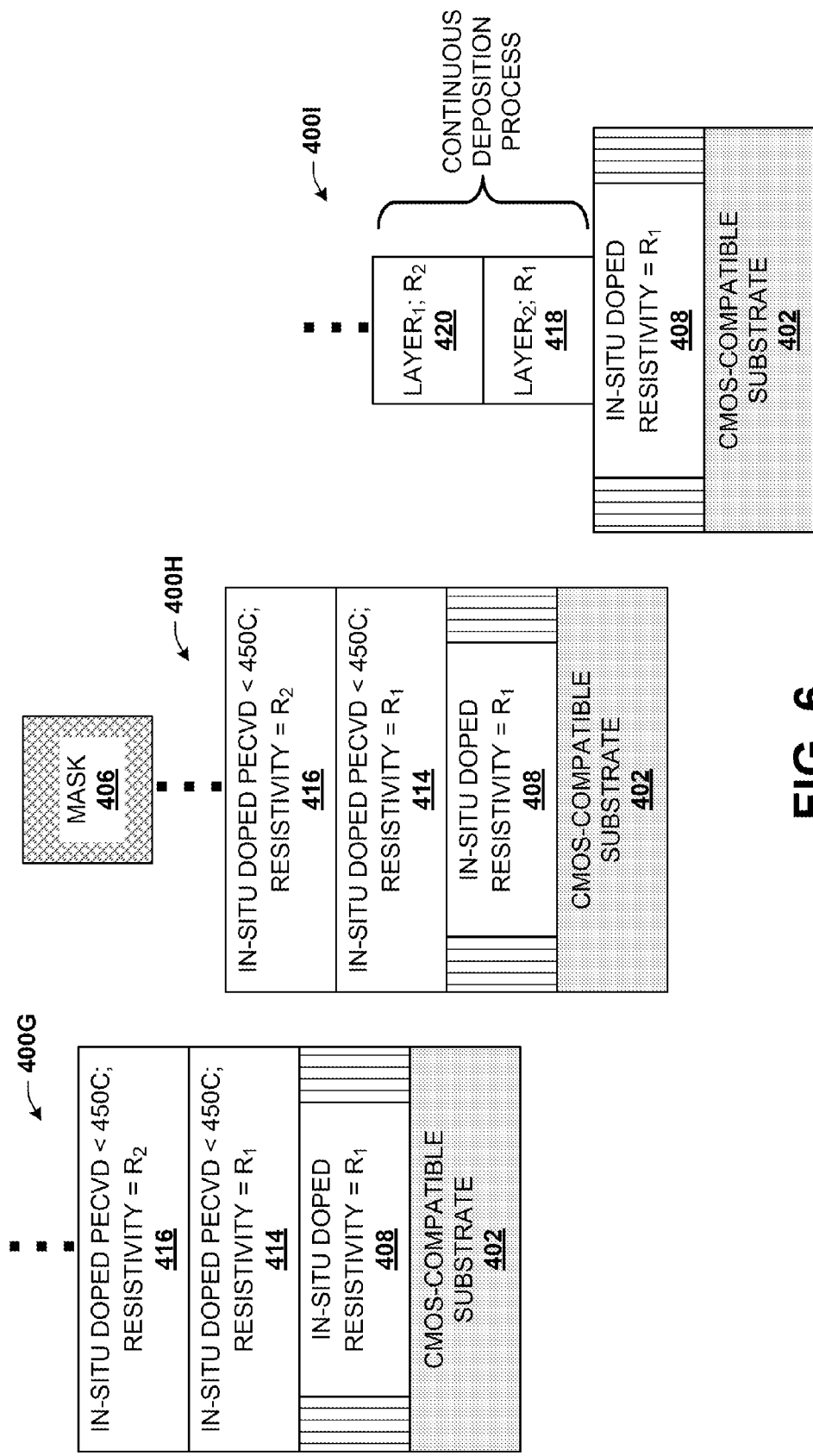

FIGS. 4-6 illustrate block diagrams of an example deposition process according to one or more aspects of the subject disclosure. The deposition process is depicted in multiple stages, from 400A through 400I, and may be used to form any of the devices described herein. It should be appreciated that these stages are not exclusive, and more or fewer stages could be employed to perform a similar deposition process within the scope of the subject disclosure. In addition, it should be appreciated that these steps need not necessarily be performed in the same order as discussed below. Rather, another order could be performed, and such other order(s) as might be made known to one or ordinary skill in the art by way of the context provided herein are also considered within the scope of the subject disclosure.

Referring to FIG. 4, there are depicted three steps, including step 400A, 400B and 400C. At 400A, a substrate 402 is provided. The substrate 402 can be a CMOS-compatible substrate, such as a Si substrate or Si derivative (e.g., SiGe, Si carbide, and so on). At 400B, a Si-based film 404 is deposited on top of the substrate 402. The Si-based film 404 can be doped with a PECVD or LPCVD process at or below 450 degrees Celsius to have a target resistivity suitable for a bottom electrode of a memory cell (e.g., a resistive-switching memory cell). The Si-based film 404 can be deposited on top of one or more metals, which can be wires or electrodes in some aspects. In other aspects, the Si-based film 404 can be deposited directly on the substrate 402. At 400C, a mask 406 is formed on the Si-based film 404.

Referring now to FIG. 5, at 400D the mask and an exposed portion of Si-based film 404 are etched to provide an etched Si-based film 408. At 400E, a fill material 410 is patterned above the etched Si-based film 408 and an exposed region of substrate 402. At 400F, a portion of the fill material 410 above the etched Si-based film 408 is removed, exposing an upper surface of the etched Si-based film 408.

Referring now to FIG. 6, at 400G a stack of Si-based layers are deposited on top of the etched Si-based film 408, and the fill material 410. The stack of Si-based layers can include a first memory cell layer 414 and a second memory cell layer 416 in one or more aspects of the subject disclosure. However, it should be appreciated that more or fewer memory cell layers can be deposited to form the stack of Si-based layers in other aspects. Further, the stack of memory cell layers can be respectively doped to have respective resistivity values. In at least one aspect, the first memory cell layer 414 can be doped to a resistivity value of $R_1$, which can be the same or substantially the same as a resistivity value $R_1$ of etched Si-based film 408. According to this aspect(s), the second memory cell layer 416 can be doped to a second resistivity value $R_2$. Moreover, the second resistivity value $R_2$ can be smaller than the resistivity value $R_1$.

At 400H, a mask 406 can be formed on the stack of Si-based layers, as depicted. At 400I, the mask and exposed portions of first memory cell layer 414 and second memory cell layer 416 can be etched away. After etching, the stack of Si-based layers comprises an etched first memory cell layer 418, an etched second memory cell layer 420, and the like. Thus, in at least one disclosed aspect, etched first memory cell layer 418 and etched second memory cell layer 420 can be deposited, doped and etched utilizing a continuous deposition process without intervening interface layers. Although not specifically depicted in 400I, a resistive switching material, and a top electrode can be formed above the etched stack of Si-based layers 418, 420, as illustrated in FIG. 1.

The aforementioned diagrams have been described with respect to interaction between several components of a memory cell, or memory architectures comprised of such memory cells. It should be appreciated that in some suitable alternative aspects of the subject disclosure, such diagrams can include those components and architectures specified therein, some of the specified components/architectures, or additional components/architectures. Sub-components can also be implemented as electrically connected to other sub-components rather than included within a parent architecture. Additionally, it is noted that one or more disclosed processes can be combined into a single process providing aggregate functionality. For instance, a deposition process can comprise a fill or etching process, or vice versa, to facilitate deposition, filling or etching of memory cell layers by way of an aggregate process. Components of the disclosed architectures can also interact with one or more other components not specifically described herein but known by those of skill in the art.

Figure 7:
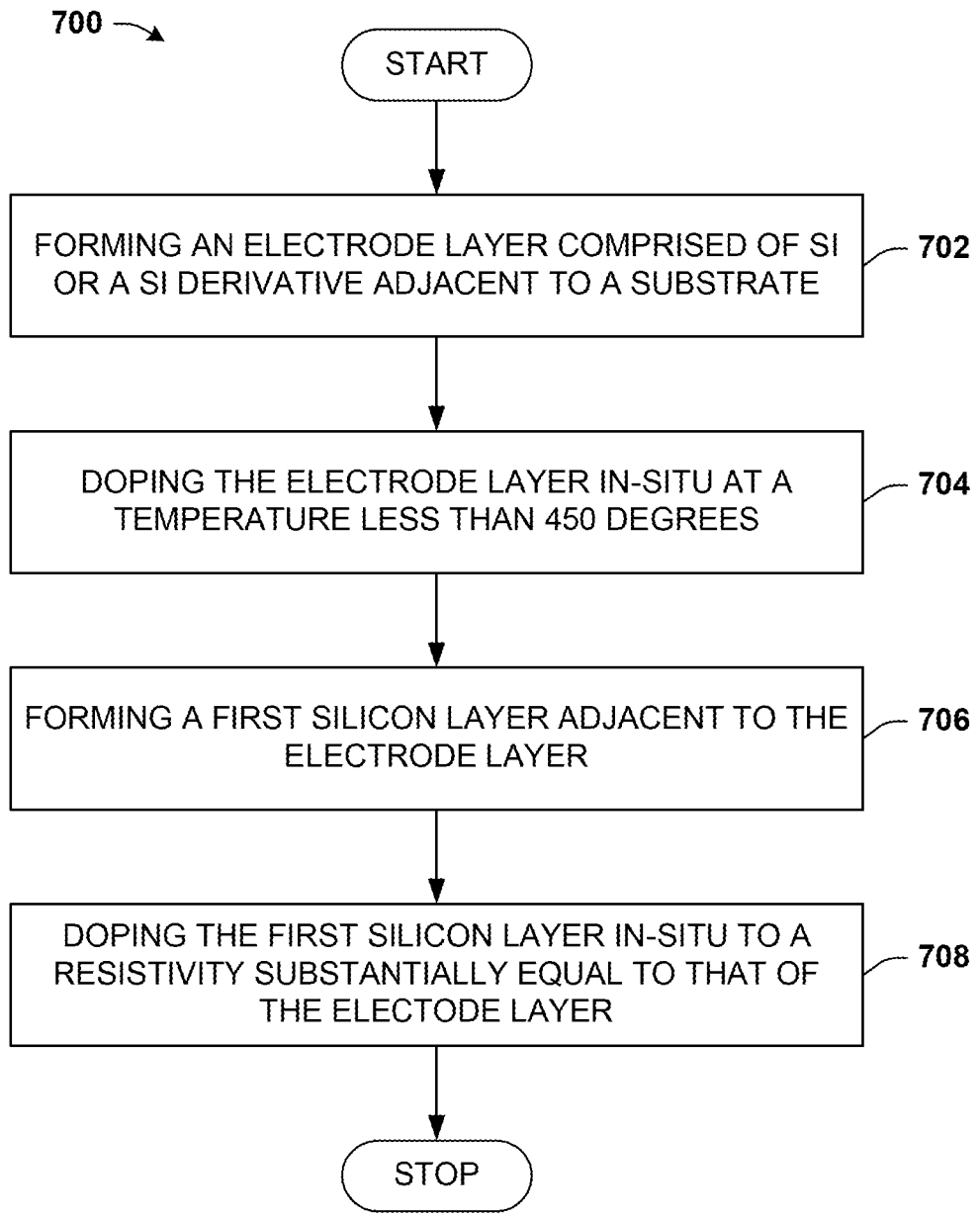
FIG. 7 illustrates a flowchart of an example method of fabricating a two-terminal memory cell according to one or more aspects.
Figure 8:
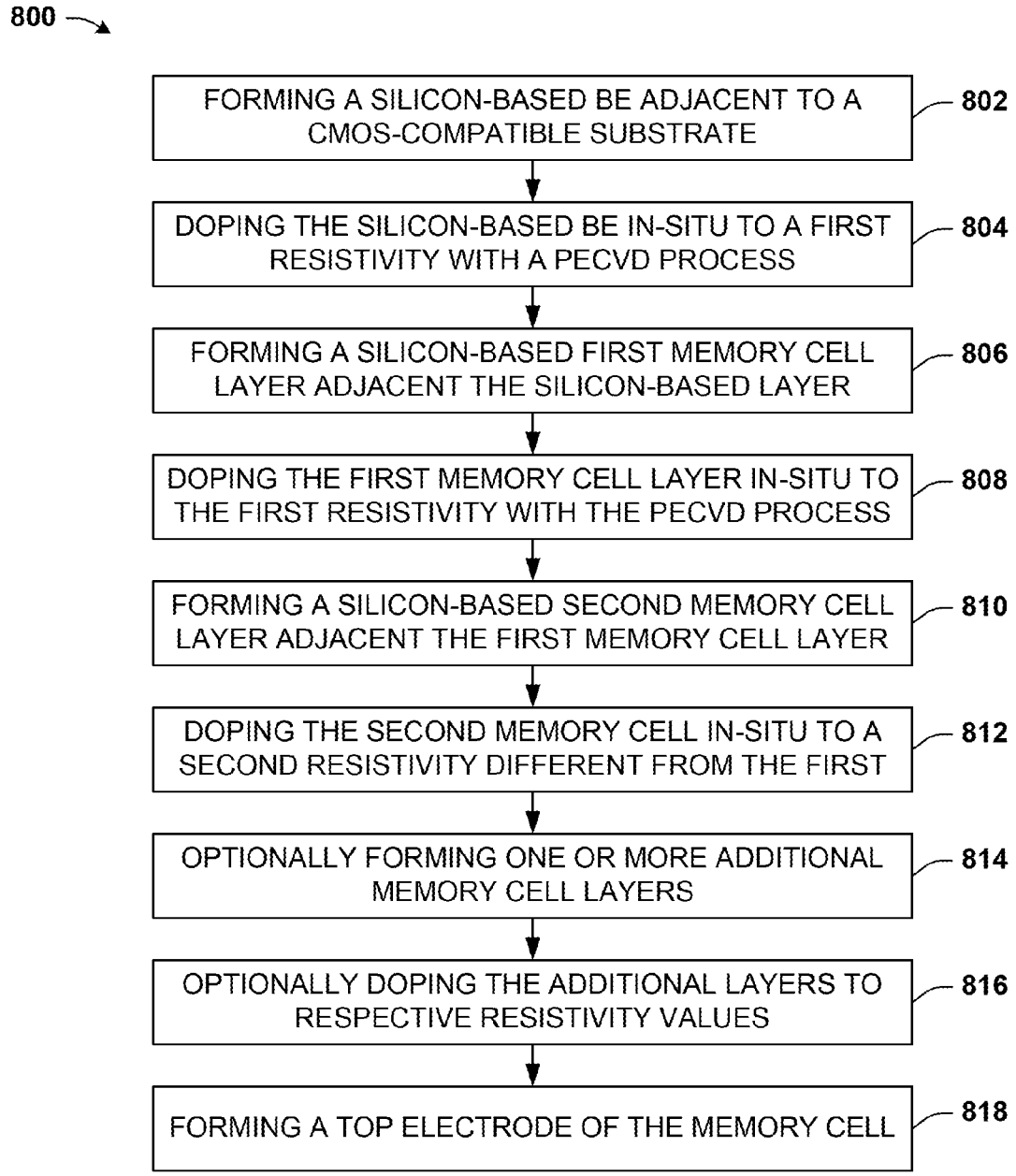
FIG. 8 depicts a flowchart of an example method of fabricating a resistive-switching memory with silicon-based electrode at low temperature, in an aspect.

In view of the exemplary diagrams described supra, process methods that can be implemented in accordance with the disclosed subject matter will be better appreciated with reference to the flow charts of FIGS. 7 and 8. While for purposes of simplicity of explanation, the methods of FIGS. 7 and 8 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

FIG. 7 illustrates a flowchart of an example method 700 for fabricating a memory cell according to additional embodiments of the subject disclosure. At 702, method 700 can comprise forming an electrode layer comprised of Si or a Si derivative adjacent to a substrate. The substrate can be a CMOS-compatible material or device, such as a Si wafer, or the like. As discussed, the substrate may include one or more CMOS components formed therein/thereon. Additionally, the electrode layer can be Si, SiGe, Si carbide, or another suitable form of Si that can be doped to a selected conductivity value with a suitable dopant and doping process.

At 704, method 700 can comprise doping the electrode layer in-situ at a temperature less than or equal to 450 degrees Celsius. The doping can comprise a PECVD process or a LPCVD process, as examples. In some aspects, the temperature can be between about 450 degrees and about 400 degrees. In other aspects, the temperature can be between about 400 degrees and about 350 degrees. In still other aspects, the temperature can be between about 350 degrees and about 300 degrees. In yet another aspect, the temperature can be about 290 degrees. In at least one other aspect, the temperature can be between about 300 degrees and about 250 degrees. Furthermore, the doping can utilize an n-type or a p-type dopant. The doping can deposit a suitable density of charged particles to give the electrode layer the selected conductivity. In at least one aspect, the selected conductivity can have a value comparable to that of a metal, such as Al, Cu, and so forth, although the subject disclosure is not limited to this aspect(s), and the selected conductivity can have other values instead.

At 706, method 700 can comprise forming a first Si layer adjacent to the electrode layer. It should be appreciated that method 700 can comprise forming additional Si layers, further to the first Si layer in some aspects. For instance, respective Si layers can be formed for multi-level current control layers of a memory cell. One or more of the additional layers can be formed from one or more Si-based materials (e.g., Si, SiGe, Si carbide, etc.), or can be formed respectively of one or more non Si-based materials (e.g., a metal, or other suitable memory cell material).

At 708, method 700 can comprise doping the first Si layer in-situ at a temperature less than 450 degrees Celsius. In at least one aspect, the doping can be performed with a PECVD or LPCVD process. Further, in an alternative or additional aspect, doping the first Si layer can comprise doping the first Si layer to a conductivity value that is equal to or substantially equal to the conductivity value of the electrode layer. Method 700 can further comprise forming a second Si layer adjacent to the first Si layer, and doping the second Si layer in-situ such that the second Si layer has a substantially different conductivity value from the electrode layer and the first Si layer. In one or more aspects, forming the electrode layer and the first Si layer can be a continuous deposition without an interceding interface layer(s). In some embodiments, method 700 can further comprise forming a resistive-switching medium on top of the Si layers and a top electrode on the resistive-switching medium.

FIG. 8 depicts a flowchart of a sample method 800 according to one or more further disclosed embodiments. At 802, method 800 can comprise forming a Si-based bottom electrode adjacent to a CMOS-compatible substrate material. At 804, method 800 can comprise doping the silicon-based bottom electrode in-situ to a first resistivity utilizing a PECVD or LPCVD process. At 806, method 800 can comprise forming a Si-based first memory cell layer adjacent to the Si-based layer. At 808, method 800 can comprise doping the first memory cell layer in-situ to the first resistivity with the PECVD or LPCVD process. At 810, method 800 can comprise forming a Si-based second memory cell layer adjacent the first memory cell layer. At 812, method 800 can comprise doping the second memory cell layer in-situ to a second resistivity different from the first resistivity. At 814, method 800 can optionally comprise forming one or more additional memory cell layers. At 816, method 800 can optionally comprise doping the additional memory cell layer(s) to respective resistivity values. At 818, method 800 can comprise forming a resistive-switching medium and a top electrode of the memory cell.

In various disclosed aspects, forming and doping the Si-based bottom electrode, forming and doping the first memory cell layer, forming and doping the second memory cell layer, and optionally forming and doping the one or more additional memory cell layers can be conducted with a PEC VD or LPCVD process at less than about 450 degrees Celsius, as described herein. Further, at least a subset of the foregoing layering can be accomplished without intervening interface layers, resulting at least in part in a continuous deposition process for creating a two-terminal memory cell device.

Figure 9:
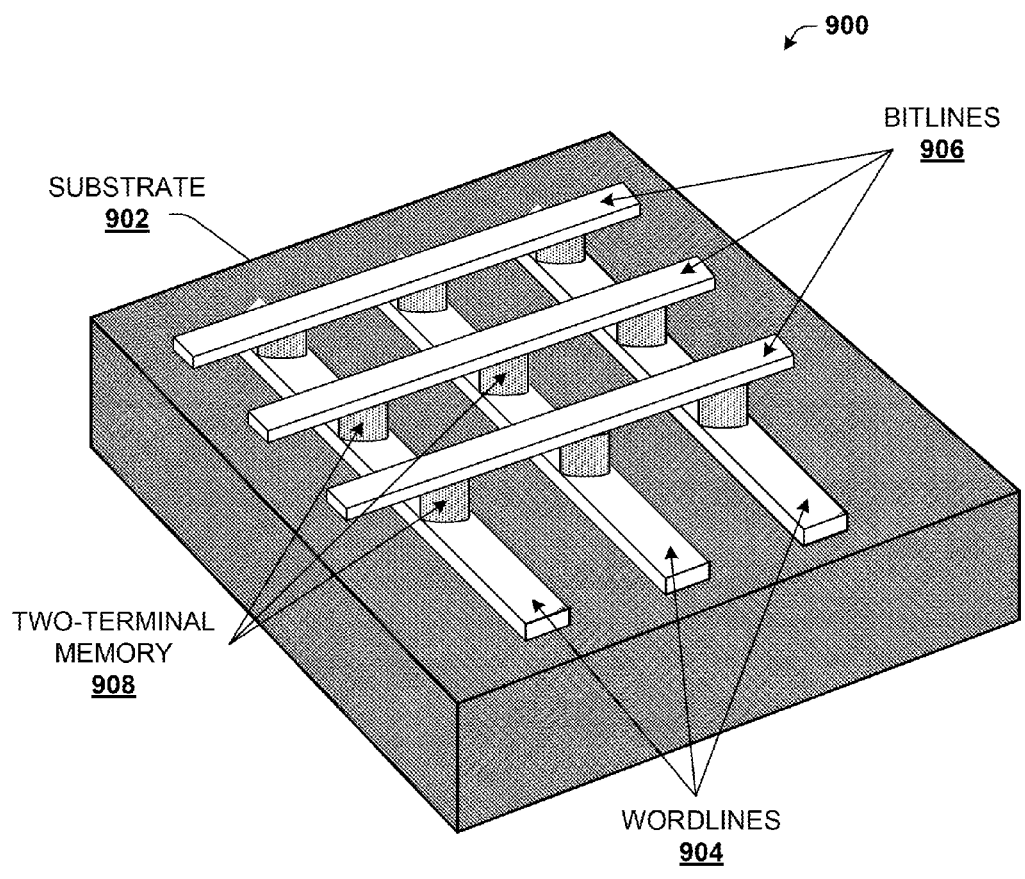
FIG. 9 illustrates a block diagram of an example crossbar memory cell array according to one or more disclosed aspects.

FIG. 9 illustrates a block diagram of an example crossbar memory array 900 according to one or more additional aspects of the subject disclosure. Crossbar memory array 900 can comprise a set of two-terminal memory cells 908. In various embodiments, two-terminal memory cells 908 can comprise one or more memory cells as described in one or more of FIGS. 1-3, supra, or fabricated according to one or more of the fabrication processes described in FIGS. 4-8, supra. In at least one aspect, two-terminal memory cells 908 can comprise resistive-switching memory cells deposited in-situ at a temperature below about 450 degrees Celsius, having a set of layers respectively doped to pre-selected resistivity values, and formed at least in part as a continuous deposition process in which two or more of the set of layers are formed without an intervening interface layer(s) between subsets of the two or more of the set of layers, in a manner compatible with at least one CMOS-type deposition technique(s).

As depicted, crossbar memory array 900 can comprise a substrate 902 underlying other components of crossbar memory array 900. Substrate 902 can be, for instance, a Si wafer or other suitable substrate compatible with at least some CMOS-related semiconductor fabrication techniques. Above substrate 902 are deposited a set of wordlines 904. Wordlines 904 are configured as electrical conductors to facilitate application of a voltage or current to subsets of two-terminal memory cells 908. In at least one aspect of the subject disclosure, wordlines 904 can be a Si-based film deposited in-situ and doped to a suitable resistivity value(s). The deposition or doping can be performed at suitable temperature equal to or below 450 degrees Celsius, such as with a PECVD or LPCVD process.

Above and intersecting wordlines 904 are a set of bitlines 906. In at least one aspect of the subject disclosure, bitlines 906 can be a Si-based film deposited in-situ and doped to a suitable resistivity value(s) via the PECVD or LPCVD process. In other aspects, bitlines 906 can be another conductive material, such as a metal as one example. Positioned at respective intersections of respective wordlines 904 and bitlines 906 are respective ones of the two-terminal memory cells 908. Two-terminal memory cells 908 can be formed as a continuous deposition, in one or more disclosed aspects, according to at least one of the processes described herein or a related process made known to one or ordinary skill in the art by way of the context provided by the subject disclosure.

It should be appreciated that crossbar memory array 900 can provide several advantages over other memory cell arrays. For instance, crossbar memory array 900 can comprise two-terminal memory, such as resistive-switching memory, having high density per unit area of crossbar memory array 900, relatively fast switching times, and fast read, write or erase times. In addition, crossbar memory array 900 can be fabricated at least in part utilizing CMOS-related fabrication techniques, mitigating or avoiding substantial overhead costs in modifying CMOS-related fabrication techniques to other techniques proposed for two-terminal memory, but requiring high operating temperatures (e.g., doping temperatures of 750 degrees Celsius), or several interface layers. Because crossbar memory array 900 can be fabricated at least in part utilizing a continuous deposition that avoids at least some of the interface layering, fabrication of crossbar memory array 900 can be simpler, reducing error. Accordingly, the inventors of the present application believe that memory described herein and utilized with crossbar memory array 900 can be fabricated at significantly lower cost than other proposed techniques.

Figure 10:
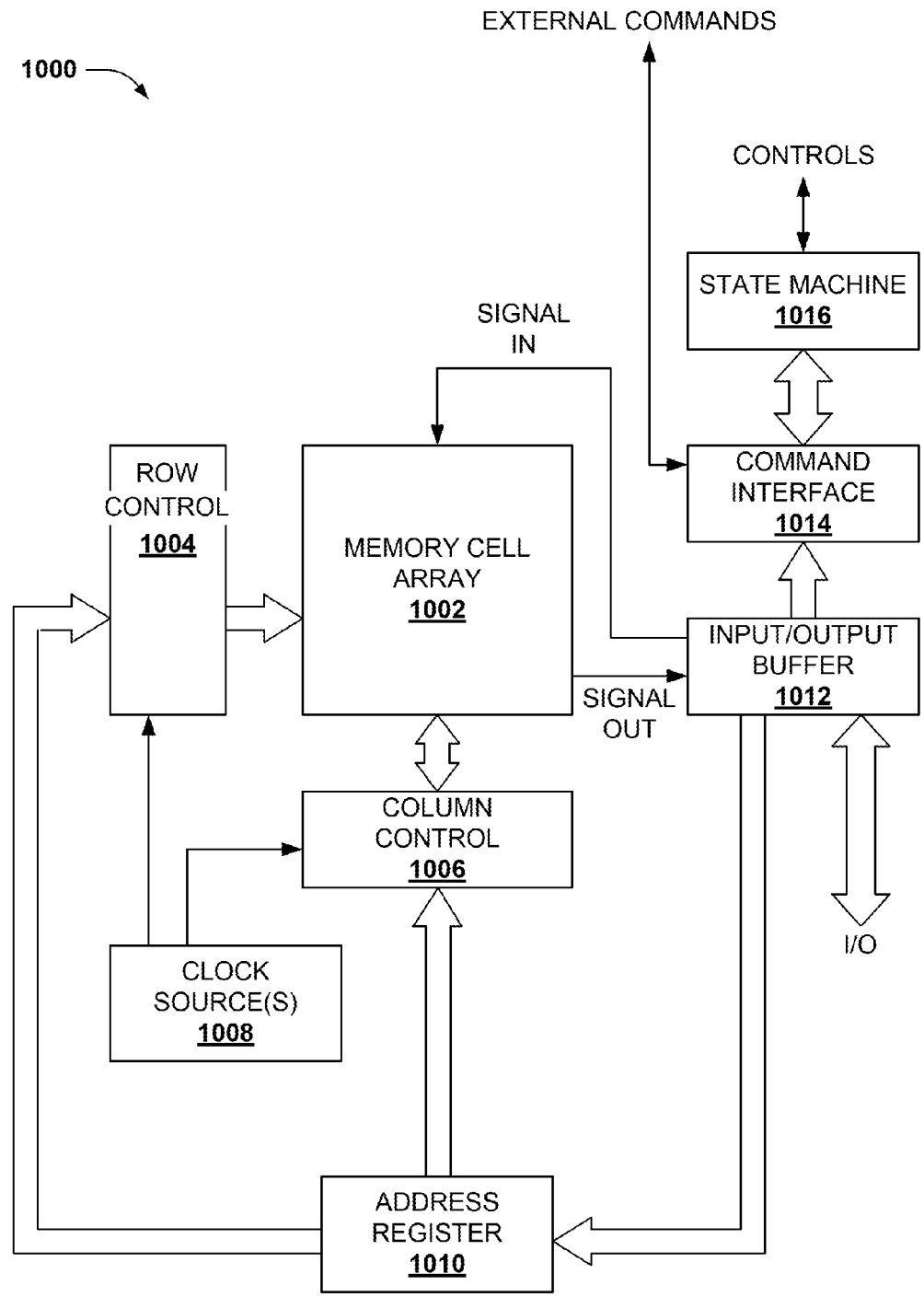
FIG. 10 depicts a block diagram of a sample operating environment for facilitating implementation of one or more aspects disclosed herein.

In order to provide a context for the various aspects of the disclosed subject matter, FIG. 10, as well as the following discussion, is intended to provide a brief, general description of a suitable environment in which various aspects of the disclosed subject matter can be implemented or processed. While the subject matter has been described above in the general context of semiconductor architectures and process methodologies for fabricating such architectures, those skilled in the art will recognize that the subject disclosure also can be implemented in combination with other architectures or process methodologies. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 10 illustrates a block diagram of an example operating and control environment 1000 for a memory cell array 1002 according to aspects of the subject disclosure. In at least one aspect of the subject disclosure, memory cell array 1002 can comprise a variety of memory cell technology. Particularly, memory cell array 1002 can comprise two-terminal memory such as resistive-switching memory cells, as described herein.

A column controller 1006 can be formed adjacent to memory cell array 1002. Moreover, column controller 1006 can be electrically coupled with bit lines of memory cell array 1002. Column controller 1006 can control respective bitlines, applying suitable program, erase or read voltages to selected bitlines.

In addition, operating and control environment 1000 can comprise a row controller 1004. Row controller 1004 can be formed adjacent to column controller 1006, and electrically connected with word lines of memory cell array 1002. Row controller 1004 can select particular rows of memory cells with a suitable selection voltage. Moreover, row controller 1004 can facilitate program, erase or read operations by applying suitable voltages at selected word lines.

A clock source(s) 1008 can provide respective clock pulses to facilitate timing for read, write, and program operations of row control 1004 and column control 1006. Clock source(s) 1008 can further facilitate selection of word lines or bit lines in response to external or internal commands received by operating and control environment 1000. An input/output buffer 1012 can be connected to an external host apparatus, such as a computer or other processing device (not depicted) by way of an I/O buffer or other I/O communication interface. Input/output buffer 1012 can be configured to receive write data, receive an erase instruction, output readout data, and receive address data and command data, as well as address data for respective instructions. Address data can be transferred to row controller 1004 and column controller 1006 by an address register 1010. In addition, input data is transmitted to memory cell array 1002 via signal input lines, and output data is received from memory cell array 1002 via signal output lines. Input data can be received from the host apparatus, and output data can be delivered to the host apparatus via the I/O buffer.

Commands received from the host apparatus can be provided to a command interface 1014. Command interface 1014 can be configured to receive external control signals from the host apparatus, and determine whether data input to the input/output buffer 1012 is write data, a command, or an address. Input commands can be transferred to a state machine 1016.

State machine 1016 can be configured to manage programming and reprogramming of memory cell array 1002. State machine 1016 receives commands from the host apparatus via input/output interface 1012 and command interface 1014, and manages read, write, erase, data input, data output, and like functionality associated with memory cell array 1002. In some aspects, state machine 1016 can send and receive acknowledgments and negative acknowledgments regarding successful receipt or execution of various commands.

To implement read, write, erase, input, output, etc., functionality, state machine 1016 can control clock source(s) 1008. Control of clock source(s) 1008 can cause output pulses configured to facilitate row controller 1004 and column controller 1006 implementing the particular functionality. Output pulses can be transferred to selected bit lines by column controller 1006, for instance, or word lines by row controller 1004, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory cell, comprising:
   a silicon (Si) stack consisting of a plurality of Si-based layers formed into a resistive switching memory layer that enters a first electrical state in response to application of a first electrical signal to the memory cell and enters a second electrical state in response to application of a second electrical signal to the memory cell, wherein the second electrical signal has a different magnitude or polarity than the first electrical signal, wherein the plurality of Si-based layers comprise at least a first Si or Si derivative layer doped to a first resistance value and a second Si or Si derivative layer doped to a second resistance value different from the first resistance value, wherein the first Si or Si derivative layer and the second Si or Si derivative layer are adjacent layers within the Si stack without an intervening layer; and
   a wiring layer comprised of Si or a Si derivative configured to facilitate application of the first electrical signal or the second electrical signal to the memory cell, wherein the wiring layer is formed adjacent to the Si stack.

2. The memory cell of claim 1, wherein the Si stack or the wiring layer is adjacent to a complementary metal-oxide semiconductor (CMOS) substrate.

3. The memory cell of claim 1, wherein the Si or the Si derivative of the wiring layer is doped with n-type or p-type dopants to have a target conductivity value selected to facilitate the wiring layer performing as an electrode to the resistive switching memory layer.

4. The memory cell of claim 3, wherein the target conductivity value is equal to or greater than a conductivity value of the Si stack in at least the first electrical state or the second electrical state.

5. The memory cell of claim 3, wherein the dopant is selected from at least one of: boron, indium, gallium, phosphorus, arsenic or antimony.

6. The memory cell of claim 3, wherein the wiring layer is doped in-situ while adjacent to a CMOS substrate or to the Si stack.

7. The memory cell of claim 1, wherein the wiring layer is formed via a plasma-enhanced chemical vapor deposition (PECVD) process.

8. The memory cell of claim 7, wherein the wiring layer is formed via the PECVD process at a temperature less than 350 degrees Celsius.

9. The memory cell of claim 7, wherein the wiring layer is formed via the PECVD process at a temperature less than 290 degrees Celsius.

10. The memory cell of claim 1, wherein the memory cell is one of a set of such memory cells arranged in a crossbar memory architecture.

11. The memory cell of claim 1, wherein the Si derivative is a Si Germanium deposited using a low pressure chemical vapor deposition (LPCVD) or a PECVD process.

12. The memory cell of claim 1, wherein the Si derivative is a Si Germanium doped with at least one selected from the list of: boron, indium, gallium, phosphorus, arsenic or antimony.

13. The memory cell of claim 1, wherein the Si-based layers are doped using at least one of an n-type dopant or p-type dopant.

14. The memory cell of claim 1, wherein the wiring layer and Si stack are in direct contact without an intervening interface layer.

15. The memory cell of claim 1, wherein:
the wiring layer has a resistivity between about 10 milliOhm-centimeters (mOhm-cm) and about 10 Ohm-cm; and
the first Si layer has resistivity between about 10 mOhm-cm and about 10 Ohm-cm, and the second Si layer has resistivity between about 2 mOhm-cm and about 100 mOhm-cm.

16. A crossbar memory array; comprising:
a plurality of memory cells, wherein at least one of the plurality of memory cells is configured to have a silicon (Si) stack consisting of a plurality of Si-based layers formed into a resistive switching memory layer, the Si-based layers formed of Si or a Si derivative that are doped in-situ to respective target resistance values, wherein the resistive switching memory layer enters a first electrical state in response to a first electrical signal and enters a second electrical state in response to a second electrical signal, and further wherein the plurality of memory cells are arranged in an array comprising at least two-dimensions, wherein the plurality of Si-based layers comprise at least a first Si or Si derivative layer doped to a first resistance value and a second Si or Si derivative layer doped to a second resistance value different from the first resistance value, wherein the first Si or Si derivative layer and the second Si or Si derivative layer are adjacent layers without an intervening layer; and
a wiring component configured to facilitate delivery of the first or second electrical signal, wherein the wiring component is comprised of Si and doped in-situ adjacent to a complementary metal-oxide semiconductor (CMOS) substrate.

17. The crossbar memory array of claim 16, further comprising at least one of:
a second plurality of the memory cells arranged in a third dimension with respect to the plurality of memory cells.

18. The crossbar memory array of claim 16, wherein the Si of the wiring component is doped with n-type or p-type dopants to have a target conductivity value selected to facilitate the wiring layer performing as an electrode to the resistive switching memory layer.

19. The crossbar memory array of claim 16, wherein the target conductivity value is equal to or greater than a conductivity value of the resistive switching memory element in at least the first electrical state or the second electrical state.

20. The crossbar memory array of claim 16, wherein the dopant is selected from at least one of: boron, indium, gallium, phosphorus, arsenic or antimony.

* * * * *